United States Patent
Okamoto et al.

(10) Patent No.: US 7,344,657 B2
(45) Date of Patent: Mar. 18, 2008

(54) AROMATIC LIQUID-CRYSTALLINE POLYESTER COMPOSITION AND FILM OF THE SAME

(75) Inventors: Satoshi Okamoto, Tsukuba (JP); Shiro Katagiri, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 181 days.

(21) Appl. No.: 11/232,884

(22) Filed: Sep. 23, 2005

(65) Prior Publication Data

US 2006/0069190 A1    Mar. 30, 2006

(30) Foreign Application Priority Data

Sep. 30, 2004   (JP) .............................. 2004-287839

(51) Int. Cl.
| | |
|---|---|
| *C09K 19/38* | (2006.01) |
| *B32B 27/36* | (2006.01) |
| *B32B 15/09* | (2006.01) |
| *C08K 5/00* | (2006.01) |
| *C08L 67/00* | (2006.01) |
| *C08G 63/02* | (2006.01) |
| *C08J 5/18* | (2006.01) |

(52) U.S. Cl. ................. 252/299.01; 428/1.6; 428/1.62; 428/458; 428/480; 428/910; 524/284; 524/341; 528/190; 528/191; 528/193; 528/206; 528/207; 528/212; 528/306; 528/308

(58) Field of Classification Search ................. 428/1.6, 428/1.62, 209, 458, 480, 910; 524/284, 341, 524/601; 525/444; 528/176, 190, 191, 193, 528/206, 207, 212, 305, 308, 495; 252/299.01
See application file for complete search history.

(56) References Cited

U.S. PATENT DOCUMENTS

| | | | |
|---|---|---|---|
| 6,838,546 B2 | 1/2005 | Okamoto et al. | |
| 7,193,020 B2 * | 3/2007 | Ito et al. ..................... | 525/420 |
| 7,211,528 B2 * | 5/2007 | Katagiri et al. ............. | 442/117 |
| 2004/0152865 A1 | 8/2004 | Okamoto et al. | |
| 2004/0192858 A1 | 9/2004 | Katagiri et al. | |

FOREIGN PATENT DOCUMENTS

JP             05-025260       *   2/1993

OTHER PUBLICATIONS

English translation by computer for JP 05-025260.*

* cited by examiner

*Primary Examiner*—Shean C Wu
(74) *Attorney, Agent, or Firm*—Birch, Stewart, Kolasch & Birch, LLP

(57) ABSTRACT

An aromatic liquid-crystalline polyester composition is provided, which comprises at least one compound selected from an aliphatic carboxylate aryl ester and an aromatic carboxylic anhydride; an aromatic liquid-crystalline polyester; and a solvent containing at least 30% by weight of a halogen-substituted phenol compound. Using the composition, an aromatic liquid-crystalline polyester film with a low viscosity in melting state can be obtained.

5 Claims, No Drawings

AROMATIC LIQUID-CRYSTALLINE POLYESTER COMPOSITION AND FILM OF THE SAME

BACKGROUND OF THE INVENTION

1. Field of the Invention

The present invention relates to an aromatic liquid-crystalline polyester composition and a film obtained form the composition.

2. Description of the Related Art

Aromatic liquid-crystalline polyester is widely used in various fields and is mainly used in precision parts of electronic devices such as a connecter produced by injection molding method, due to low water absorption, high heat resistance and high mechanical strength. A film of aromatic liquid-crystalline polyester is used as an insulation film in a multilayered printed wiring board or flexible printed wiring board.

It is known that a film of aromatic liquid-crystalline polyester can be produced from a composition comprising 0.01 to 100 parts by weight of an aromatic liquid-crystalline polyester and 100 parts by weight of a solvent containing chlorine-substitute phenol compound (see, Japanese Patent Application Laid-Open No. 2002-114894, corresponding to U.S. Pat. No. 6,838,546). Such a conventional aromatic liquid-crystalline polyester film has a small anisotropy and a high tear strength, while the film may show an insufficient adhesiveness to a metal layer due to a relatively high viscosity of the film in melting state, when a multi-layered board is produced by superimposing a plurality the film and the metal layer.

SUMMARY OF THE INVENTION

The present inventors have intensively studied in order to obtain an aromatic liquid-crystalline polyester film which has a low viscosity in melting. As a result, it has been found that such a composition can be obtained using at least one compound selected from an aliphatic carboxylate aryl ester and an aromatic carboxylic anhydride. The present invention is has been accomplished based on the findings.

The present invention provides an aromatic liquid-crystalline polyester composition comprising:

at least one compound selected from an aliphatic carboxylate aryl ester and an aromatic carboxylic anhydride;

an aromatic liquid-crystalline polyester; and a solvent containing at least 30% by weight of a halogen-substituted phenol compound represented by formula (I):

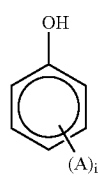

wherein A is a halogen atom or a tri-halogenated methyl and i is the number of A and is an integer of 1 to 5, provided that when i is an integer of 2 to 5, the substituents A may be the same or different.

The present invention also provides a film of the above-mentioned aromatic liquid-crystalline polyester composition; a laminate comprising the liquid-crystalline aromatic polyester film and a metal layer; and a multi-layered board comprising the liquid-crystalline aromatic polyester film and a metal layer.

In accordance with the present invention, an aromatic liquid-crystalline polyester film with a low viscosity in melting state can be obtained.

DETAILED DESCRIPTION OF THE PREFERRED EMBODIMENTS

An aromatic liquid-crystalline polyester composition in the present invention comprises:

at least one compound selected from an aliphatic carboxylate aryl ester and an aromatic carboxylic anhydride;

an aromatic liquid-crystalline polyester; and a solvent containing at least 30% by weight of a halogen-substituted phenol compound represented by formula (I):

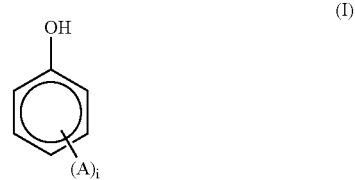

wherein A is a halogen atom or a tri-halogenated methyl and i is the number of A and is an integer of 1 to 5, provided that when i is an integer of 2 to 5, the substituents A may be the same or different.

The liquid-crystalline polyester used in the present invention may be a thermotropic liquid-crystalline polymer and may show optical anisotropy in melting at a temperature of 450° C. or lower.

Examples of the aromatic liquid-crystalline polyester include the following polyesters:

(1) a polyester comprising a repeating unit derived from an aromatic hydroxycarboxylic acid, a repeating unit derived from an aromatic dicarboxylic acid and a repeating unit derived from an aromatic diol;

(2) a polyester comprising repeating units derived from the same aromatic hydroxycarboxylic acids, or two or more different aromatic hydroxycarboxylic acids;

(3) a polyester comprising a repeating unit derived from an aromatic dicarboxylic acid and a repeating unit derived from an aromatic diol;

(4) a polyester prepared by reacting an aromatic hydroxycarboxylic acid with a crystalline polyester such as polyethylene terephthalate.

The aromatic hydroxycarboxylic acid, the aromatic dicarboxylic acid and the aromatic diol may be used in the form of ester-forming derivative thereof.

The ester-forming derivative of the aromatic hydroxycarboxylic acid and the aromatic dicarboxylic acid may be a highly reactive derivative such as a chloride or an anhydride, esters of the aromatic hydroxycarboxylic acid or the aromatic dicarboxylic acid with an alcohol or ethylene glycol which can form a polyester by transesterification. The ester-forming derivative of the aromatic diol may be an aromatic diol, the phenolic hydroxyl group of which forms an ester with a carboxylic acid which can form a polyester by transesterification.

The aromatic hydroxycarboxylic acid, the aromatic dicarboxylic acid and/or the aromatic diol may be substituted with at least one substituent as long as the ester-forming property is not deteriorated. Examples of the substituent include a halogen atom (e.g. a chlorine atom, a fluorine atom, etc.), an alkyl group (e.g. a methyl group, an ethyl group, etc.), an aryl group (e.g. a phenyl group, etc.).

Non-limiting examples of repeating units of the liquid-crystalline polyester include the following repeating units:

Repeating units derived from aromatic hydroxy-carboxylic acids

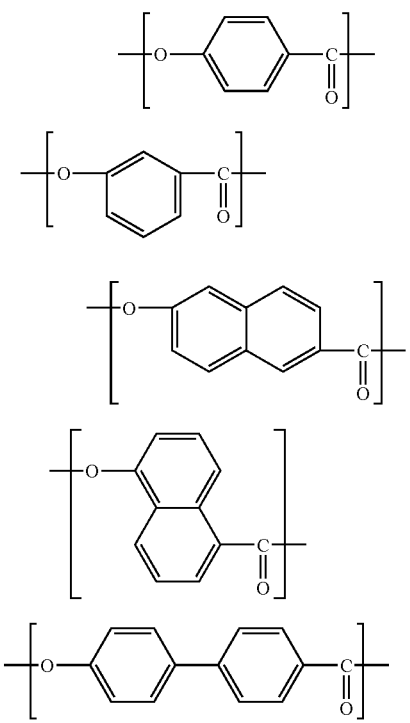

(A₁)

(A₂)

The above repeating units may be substituted with a halogen atom (e.g. a chlorine atom, a fluorine atom, a bromine atom, an iodine atom, etc.) or an alkyl group.

Repeating units derived from aromatic dicarboxylic acids

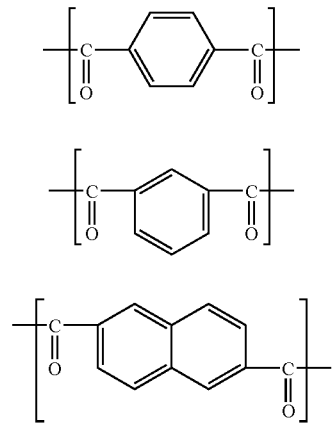

(B₁)

(B₂)

(B₃)

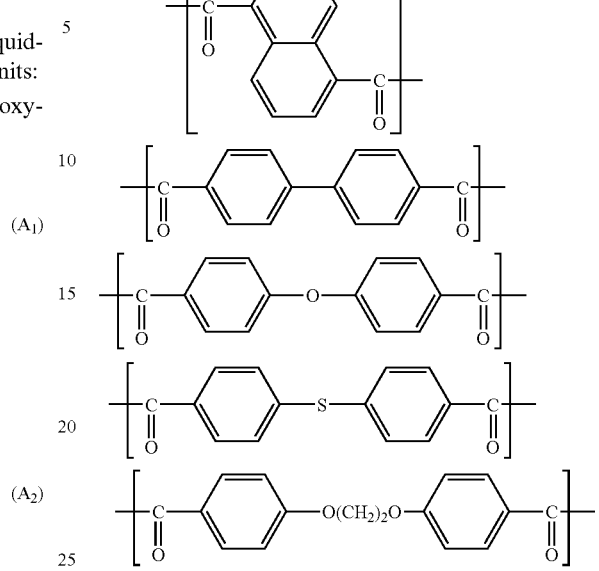

-continued

The above repeating units may be substituted with a halogen atom (e.g. a chlorine atom, a fluorine atom, a bromine atom, an iodine atom, etc.), an alkyl group or an aryl group.

Repeating units derived from aromatic diols

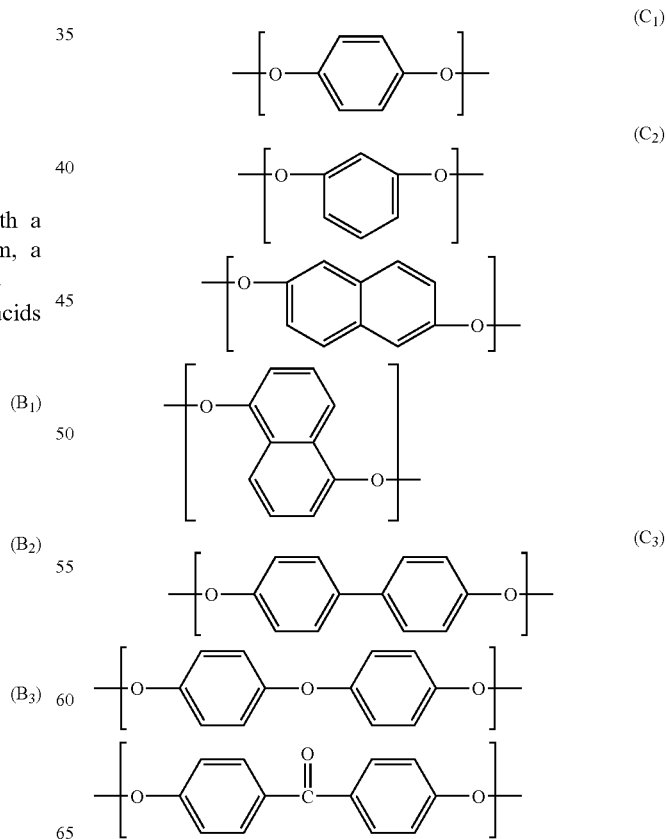

(C₁)

(C₂)

(C₃)

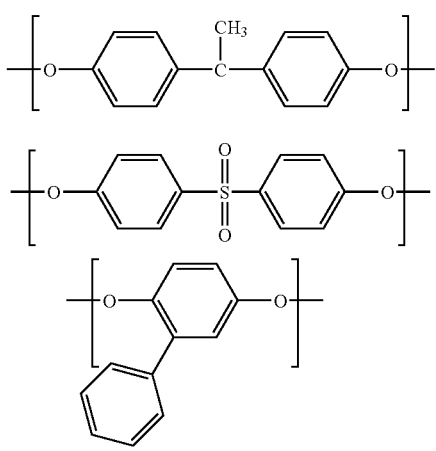

The above repeating units may be substituted with a halogen atom (e.g. a chlorine atom, a fluorine atom, a bromine atom, an iodine atom, etc.), an alkyl group or an aryl group.

Preferably, the above-described alkyl groups have 1 to 10 carbon atoms, and the above-described aryl groups have 6 to 20 carbon atoms. Specific examples of the alkyl groups include a methyl group, an ethyl group, a butyl group, etc., and specific examples of the aryl groups include a phenyl group, etc.

Preferably, the liquid-crystalline polymer comprises at least 30% by mole of the repeating units represented by formula ($A_1$) from the viewpoint of the balance of heat resistance and mechanical properties.

Preferably, combinations of the repeating units are the following combinations (a) to (f):

(a):
(a1) Combination of the repeating units ($A_1$), ($B_2$) and ($C_3$);
(a2) Combination of the repeating units ($A_2$), ($B_2$) and ($C_3$);
(a3) Combination of the repeating units ($A_1$), ($B_1$), ($B_2$) and ($C_3$);
(a4) Combination of the repeating units ($A_2$), ($B_1$), ($B_2$) and ($C_3$);
(b): Combinations (a1) to (a4) in which at least a part of the repeating units ($C_3$) are replaced by the repeating units ($C_1$);
(c): Combinations (a1) to (a4) in which at least a part of the repeating units ($C_3$) are replaced by the repeating units ($C_2$);
(d): Combinations (a1) to (a4) in which at least a part of the repeating units ($C_3$) are replaced by the repeating units ($C_4$);
(e): Combinations (a1) to (a4) in which at least a part of the repeating units ($C_3$) are replaced by the mixture of the repeating units ($C_4$) and ($C_5$);
(f): Combinations (a1) to (a4) in which a part of the repeating units ($A_1$) are replaced by the repeating units ($A_2$).

From the viewpoint of heat resistance, the aromatic liquid-crystalline polyester preferably comprises 30 to 80% by mole of repeating units ($A_1$) and/or ($A_2$), which are derived from at least one compound consisting of p-hydroxybenzoic acid and 2-hydroxy-6-naphthoic acid; 10 to 35% by mole of repeating units ($C_1$) and/or ($C_3$), which are derived from at least one compound selected from the group consisting of hydroquinone and 4,4'-dihydroxybiphenyl; and 10 to 35% by mole of repeating units ($B_1$) and/or ($B_2$), which are derived from at least one compound selected from the group consisting of terephthalic acid and isophthalic acid.

The weight average molecular weight of the aromatic liquid-crystalline polyester is not limited, and is preferably from 10,000 to 100,000.

The method for producing the aromatic liquid-crystalline polyester used in the present invention is not limited. For example, the aromatic liquid-crystalline polyester in the present invention can be produced by a method in which at least one compound selected from the group consisting of the aromatic hydroxycarboxylic acids and the aromatic diols is acylated with an excessive amount of an aliphatic carboxylic anhydride to obtain an acylated compound, and then the acylated compound is melt-polymerized with at least one carboxylic acid selected from the group consisting of the aromatic hydroxycarboxylic acids and the aromatic dicarboxylic acids by transesterification (polycondensation).

In the acylation process, the amount of the carboxylic anhydride is preferably from 1.0 to 1.2 equivalents, more preferably from 1.05 to 1.1 equivalents, per one equivalent of the phenolic hydroxyl group. When the amount of the carboxylic anhydride is too small, the acylated compound and the aromatic hydroxycarboxylic acid, the aromatic dicarboxylic acid, etc. tend to sublimate during the transesterification (polycondensation) so that a reaction system may be clogged. When the amount of the carboxylic anhydride exceeds the above upper limit, the liquid-crystalline polyester obtained tends to be noticeably colored.

The acylation is preferably carried out at a temperature of 130 to 180° C. for 5 minutes to 10 hours, more preferably at a temperature of 140 to 160° C. for 10 minutes to 3 hours.

The kind of the carboxylic anhydride used for acylation is not critical. Examples of the carboxylic anhydride include acetic anhydride, propionic anhydride, butyric anhydride, isobutyric anhydride, valeric anhydride, pivalic anhydride, 2-ethylhexanoic anhydride, monochloroacetic anhydride, dichloroacetic anhydride, trichloroacetic anhydride, monobromoacetic anhydride, dibromoacetic anhydride, tribromoacetic anhydride, monofluoroacetic anhydride, difluoroacetic anhydride, trifluoroacetic anhydride, glutaric anhydride, maleic anhydride, succinic anhydride, β-bromopropionic anhydride, etc. These anhydrides may be used independently or in admixture of two or more of them. Among them, acetic anhydride, propionic anhydride, butyric anhydride and isobutyric anhydride are preferable from the viewpoint of their costs and handling properties. More preferably, acetic anhydride is used.

In the transesterification, the acylated compound is preferably used in such an amount that the equivalent of the acyl group is 0.8 to 1.2 times the equivalent of the carboxyl group.

The transesterification is preferably carried out in a temperature range between 130 and 400° C. while raising a temperature at a rate of 0.1 to 50° C./min., more preferably in a temperature range between 150 and 350° C. while raising a temperature at a rate of 0.3 to 5° C./min.

The unreacted carboxylic anhydride and by-produced carboxylic acids are preferably removed from the reaction system by, for example, evaporation to shift the equilibrium in reaction to the product side during the transesterification of the carboxylate ester prepared by acylation with the carboxylic acid.

The acylation and/or the transesterification may be carried out in the presence of a catalyst. The catalyst may be a conventional catalyst used as a polymerization catalyst for polyester. Specific examples of the catalyst include metal salt catalysts (e.g. magnesium acetate, stannous acetate, tetrabutyl titanate, lead acetate, sodium acetate, potassium acetate, antimony trioxide, etc.), organic compound catalysts (e.g. N,N-dimethylaminopyridine, N-methylimidazole, etc.), and so on. The catalyst may be added to a reactor when the monomers are charged in the reactor. The catalyst used in the acylation may not necessarily be removed, and the reaction mixture obtained by the acylation may be subjected to the transesterification.

The polycondensation through transesterification may be carried out by melt-polymerization, which may be followed by solid-phase polymerization. When the solid-phase polymerization is conducted, the polymer from the melt-polymerization is preferably milled to obtain the powder-form or flake-form polymer and then it is subjected to the conventional solid-phase polymerization. Concretely, the polymer in the solid state from the melt-polymerization is heated in an atmosphere of an inert gas such as nitrogen at a temperature of 20 to 350° C. for 1 to 30 hours. The solid-phase polymerization may be carried out with or without agitating the polymer. When a reactor is equipped with a suitable agitation mechanism, the melt-polymerization and the solid-phase polymerization can be carried out in the same reactor. After the solid-phase polymerization, the aromatic liquid-crystalline polyester obtained may be pelletized in a conventional manner and then molded or shaped.

The aromatic liquid-crystalline polyester may be produced batchwise or continuously.

In the present invention, an aromatic liquid-crystalline polyester composition comprises a solvent containing at least 30% by weight of a halogen-substituted phenol compound represented by the formula (I):

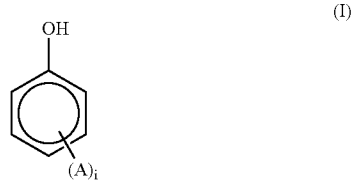

wherein A is a halogen atom or a tri-halogenated methyl and i is the number of A and is an integer of 1 to 5, provided that when i is an integer of 2 to 5, the substituents A may be the same or different. The solvent preferably contains at least 60% by weight of the halogen-substituted phenol compound (I). More preferably, the solvent is the pure (100% by weight) halogen-substituted phenol compound (I).

Preferably, i in the formula (I) is 1, 2 or 3, more preferably 1 or 2. When i is 1, A is preferably present at the 4-position, and when i is at least 2, at least one of the substituents A is preferably present at the 4-position, with the substitution position of a hydroxyl group being 1-position.

When i is an integer of 2 to 5, the substituents A may be the same or different, and is preferably the same.

Examples of the halogen atom for A in the formula (I) include a fluorine atom, a chlorine atom, a bromine atom and an iodine atom. Among them, a fluorine atom and a chlorine atom are preferable, and a chlorine atom is more preferable.

Specific examples of the compound of the formula (I) in which one of As is a fluorine atom include penta-fluorophenol, tetra-fluoro-phenol, 4-chloro-2-fluorophenol, 4-chloro-3-fluoro-phenol, etc.

Specific examples of the compound of the formula (I) in which A is a chlorine atom include 2-chlorophenol (o-chlorophenol), 4-chlorophenol (p-chlorophenol), 2,4-dichlorophenol, 3,4-dichlorophenol, 2,4,5-trichlorophenol, 2,4,6-trichlorophenol, pentachlorophenol, etc. The compound of the formula (I) with a chlorine atom is preferably o-chlorophenol and p-chlorophenol, and is more preferably p-chlorophenol in view of solubility of the materials to be solved therein.

Specific examples of the compound of the formula (I) in which one of As is a bromine atom include 4-chloro-2-bromophenol, etc.

Specific examples of the compound of the formula (I) in which one of As is an iodine atom include 4-chloro-2-iodophenol, etc.

The halogen atom in the tri-halogenated methyl group for A in the formula (I) is a fluorine atom, a chlorine atom, a bromine atom or an iodine atom.

Specific examples of the compound of the formula (I) in which one of As is a tri-fluoromethyl group include 3,5-bistrifluoromethylphenol, etc.

More preferably, A in the formula (I) is a chlorine atom. In view of cost and availability, o-chlorophenol and/or p-chlorophenol is preferably used. In view of solubility of the liquid-crystalline polyester, p-chlorophenol is most preferably used.

Besides the phenol compound of the formula (I), the solvent may contain other component as long as the other component does not precipitate the liquid-crystalline polyester during storage and/or applications (mentioned below) of the solution. Examples of the other component include a chlorohydrocarbon such as chloroform, methylene chloride and tetrachloroethane.

In the aromatic liquid-crystalline polyester composition of the present invention, the aromatic liquid-crystalline polyester may be contained in the amount of 0.5 to 100 parts by weight on the basis of 100 parts by weight of the solvent contained together. In view of processability and economical efficiency, the aromatic liquid-crystalline polyester is preferably contained in the amount of 1 to 50 parts by weight, and is more preferably contained in the amount of 3 to 10 parts by weight, on the basis of 100 parts by weight of the solvent contained together. When the amount of the liquid-crystalline polyester is too small, the production efficiency of the aromatic liquid-crystalline polyester composition tends to be lowered. When the amount of the liquid-crystalline polyester is too large, the liquid-crystalline polyester may be difficult to dissolve in the composition thereof.

As mentioned above, the aromatic liquid-crystalline polyester composition in the present invention comprises at least one compound selected from an aliphatic carboxylate aryl ester and an aromatic carboxylic anhydride.

Preferable aliphatic carboxylate aryl esters which may be used in the present invention are represented by formula (II) below:

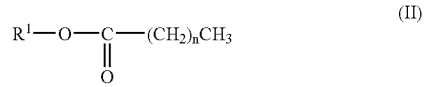

In formula (II), n indicates an integer of from 0 to 2, preferably an integer of 0 or 1, and $R^1$ indicates an aryl group which has carbon atoms of from 6 to 20 and may be substituted with a halogen atom. Preferably, $R^1$ is a phenyl group which may has a phenyl group as a substituent thereof at its 4 position.

Specific examples of the aliphatic carboxylate aryl esters represented by formula (II) include phenyl acetate, phenyl propionate, phenyl butyrate, biphenyl acetate and the like. Among them, phenyl acetate and biphenyl acetate are preferable.

Preferable aromatic carboxylic anhydrides which may be used in the prevent invention are represented by formula (III).

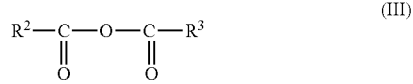

(III)

In formula (III), $R^2$ and $R^3$ independently indicate aryl groups which have carbon atoms of from 6 to 20 and may be substituted with a halogen atom. Preferably, at least one of $R^2$ and $R^3$ is a phenyl group which may has a phenyl group as a substituent thereof at its 4 position. $R^2$ and $R^3$ may be the same or different from each other.

Specific examples of the aromatic carboxylic anhydrides represented by formula (III) include benzoic anhydrides, toluic anhydrides and the like. Among them, benzoic anhydrides are preferable.

Two or more types of these aliphatic carboxylate aryl esters and/or benzoic anhydrides may be contained in the aromatic liquid-crystalline polyester composition of the present invention.

The amount (in total) of the at least one compound selected from an aliphatic carboxylate aryl ester and an aromatic carboxylic anhydride in an aromatic liquid-crystalline polyester composition of the present invention is preferably in the range of from 0.1 to 10 parts by weight, more preferably in the range of from 0.5 to 5 parts by weight, on the basis of 100 parts by weight of the aromatic liquid-crystalline polyester.

An aromatic liquid-crystalline polyester composition of the present invention may be obtained by mixing the components, i.e., at least one compound selected from an aliphatic carboxylate aryl ester and an aromatic carboxylic anhydride; an aromatic liquid-crystalline polyester; and a solvent containing at least 30% by weight of a halogen-substituted phenol compound represented by the formula (I). The order of the mixing is not particularly limited.

Preferably, the aromatic liquid-crystalline polyester composition is produced by a method in which the aromatic liquid-crystalline polyester and the solvent containing at least 30% by weight of a halogen-substituted phenol compound are mixed first, and then the at least one compound selected from an aliphatic carboxylate aryl ester and an aromatic carboxylic anhydride is mixed therewith.

The obtained liquid-crystalline polyester composition may be filtered with a filter or the like, if necessary, so as to remove foreign substances in the composition.

The aromatic liquid-crystalline polyester composition of the present invention may further comprise a high dielectric inorganic filler. Examples of the inorganic filler include at least one type of filler selected from titanates, such as barium titanate and strontium titanate, and materials obtained by replacing a portion of titanium or barium in barium titanate with another metal; and a filler obtained by combining at least 3 types selected from the group consisting of BaO, $Bi_2O_3$, $La_2O_3$, $Nd_2O_3$, $Sm_2O_3$, $Al_2O_3$ and $TiO_2$.

When the high dielectric inorganic filler is used, the amount of the filler contained is preferably in the range of 50 to 700 parts by weight, and is more preferably in the range of 200 to 500 parts by weight, on the basis of 100 parts by weight of the aromatic liquid-crystalline polyester. In the case where the amount of the filler is too small, the dielectric constant of the resulting film obtained from the composition tends to be insufficient. In the case where the amount is too large, effects of the aromatic liquid-crystalline polyester as a binder may be decrease, which tends to result in obtaining a fragile film.

Furthermore, the aromatic liquid-crystalline polyester composition of the present invention may comprise one or more types of other substances such as other inorganic fillers including silica, aluminum hydroxide and calcium carbonate; thermoplastic resins including polyamide, polyester, poly-phenylene sulfide, polyether ketone, polycarbonate, polyether sulfone, polyphenyl ether and polyether imide; thermal setting resins including phenol resins, epoxy resins, polyimide resins and cyanate resins; and additives including silane coupling agents, antioxidants and ultraviolet-ray absorbing agents.

A film of the aromatic liquid-crystalline polyester composition in the present invention can be produced, for example, by casting (applying) the composition into a film form and removing the solvent in the composition.

The casting of the composition may be employed onto a support by a method such as a roller coating method, a dip coating method, a spray coating method, a spinner coating method, a curtain coating method, a slot coating method and a screen printing method.

The removing the solvent is not particularly limited, and may be conducted in a vaporization method by heating, reducing the pressure, ventilating and the like. Among them, heating is preferable, taking into account the production efficiency and ease of handling, and in addition, heating while ventilating is more preferable. It is preferred that the heating process comprises the step of drying in advance for ten minutes to two hours at a temperature of 60° C. to 200° C. and the step of heat treatment for 30 minutes to 5 hours at a temperature of 200° C. to 400° C.

Onto the aromatic liquid crystal polyester film in the present invention, a metal layer may be placed to obtain a laminate comprising the liquid-crystalline aromatic polyester film and the metal layer. For example, a metal film may be used as a support onto which the aromatic liquid-crystalline polyester composition is applied, followed by removing the solvent in the composition to provide a laminate comprising the liquid-crystalline aromatic polyester film and the metal film.

Specific examples of the method for placing the aromatic liquid-crystalline polyester film in the present invention on the metal layer include the following methods 1-3.

[Method 1]

An aromatic liquid-crystalline polyester composition in the present invention is applied onto a metal film (which may be a well known metal foil such as a copper foil, a silver foil, a gold foil and an aluminum foil) by a various methods such as a roller coating method, a dip coating method, a spray coating method, a spinner coating method, a curtain coating method, a slot coating method and a screen printing method, to have a flat and uniform film form, and then, the solvent in the composition is removed to obtain a laminate comprising the liquid-crystalline aromatic polyester film and the metal film.

[Method 2]

An aromatic liquid-crystalline polyester composition in the present invention is applied onto a substrate having a flat surface which does not swell with the solvent in the composition by the above-described various methods to have a flat and uniform film form, and then, the solvent is removed to obtain an aromatic liquid-crystalline polyester film. After peeled off from the substrate, the liquid-crystalline polyester film is superimposed onto a metal film (which may be a well known metal foils), followed by applying heat and pressure using a press machine or a heat roll at about a temperature at which the aromatic liquid-crystalline polyester starts to flow.

[Method 3]

An aromatic liquid-crystalline polyester film is obtained in the same manner as in the above-mentioned method 2. Onto the liquid-crystalline polyester film obtained after being peeled off from the substrate, a metal film is formed by a method such as sputtering, plating or vapor deposition.

Thus-obtained aromatic liquid crystal polyester film in the present invention can be preferably used in a multi-layered board such as a multi-layered rigid printed circuit board, a multi-layered flexible printed circuit board and an embedded board, since the aromatic liquid crystal polyester in the composition has a low viscosity in melting state and a high resin fluidity. The multi-layered board in the present invention can be obtained, for example, by a method in which at least one of (preferably, a plurality of) the aromatic liquid-crystalline polyester films of the present invention and at least one of (preferably, a plurality of) metal foils are piled up, and then are heated and pressured by a press molding or the like. Alternatively, the multi-layered board can be obtained by a method in which at least one of (preferably, a plurality of) laminates of the aromatic liquid-crystalline polyester films of the present invention with metal foils are piled up, and then are heated and pressured by a press molding or the like.

As mentioned above, the aromatic liquid liquid-crystalline polyester film in the present invention is obtainable by casting an aromatic liquid liquid-crystalline polyester of the present invention onto a support and removing the solvent in the composition. The aromatic liquid liquid-crystalline polyester film has a low melt viscosity.

The invention being thus described, it will be apparent that the same may be varied in many ways. Such variations are to be regarded as within the spirit and scope of the invention, and all such modifications as would be apparent to one skilled in the art are intended to be within the scope of the following claims.

The entire disclosure of the Japanese Patent Application No. 2004-287839 filed on Sep. 30, 2004, including specification, claims and summary, are incorporated herein by reference in their entirety.

EXAMPLES

The present invention is described in more detail by following Examples, which should not be construed as a limitation upon the scope of the present invention.

Example 1

Into a reactor equipped with a stirrer, torque meter, nitrogen gas introducing tube, thermometer and reflux condenser was charged with 128 g (0.68 mol) of 2-hydroxy-6-naphthoic acid, 63.3 g (0.34 mol) of 4, 4'-dihydroxy biphenyl, 56.5 g (0.34 mol) of isophthalic acid and 152.7 g (1.50 mol) of acetic hydride. The inside of the reactor was sufficiently replaced with a nitrogen gas, and after that, the mixture was heated up to 150° C. over 15 minutes under a nitrogen gas flow, and refluxed for 3 hours while maintaining the temperature.

After that, the mixture was heated up to 320° C. over 170 minutes while distilling the by-produced acetic acid and unreacted acetic anhydride, and a point at which increase in torque was recognized was regarded as the end of the reaction, and the content was taken out. The solid content was cooled to room temperature and grounded by a grounding machine, and after that was maintained for three hours at 250° C. under a nitrogen atmosphere during which a polymerization reaction was progressing in a solid-phase, to obtain an aromatic liquid-crystalline polyester powder. A schlieren pattern that is particular to a liquid crystal phase was observed in the powder at 350° C. through a polarization microscope.

8 g of the above-obtained aromatic liquid-crystalline polyester powder was added to 92 g of p-chlorophenol. The resulting mixture of the aromatic liquid-crystalline polyester and p-chlorophenol was heated to 120° C., into which 0.08 g of phenyl acetate, which is an aliphatic carboxylate aryl ester, was mixed to obtain an aromatic liquid-crystalline polyester composition.

The obtained aromatic liquid-crystalline polyester composition was applied on a copper foil (electrolytic copper foil F2WS made by Furukawa Electric Co., Ltd. (having a thickness of 18 μm)), and the solvent was evaporated for 60 minutes at a temperature of 100° C. that was set by a hot plate. After that, a heat treatment is carried out by a hot air blow dryer for 60 minutes under conditions where the temperature was set at 280° C. in a nitrogen atmosphere, to obtain an aromatic liquid crystal polyester film (having a thickness of 25 μm) with a copper foil.

The aromatic liquid crystal polyester film with the copper foil was immersed in a ferric chloride solution so that the copper foil was removed, to obtain an aromatic liquid crystal polyester film.

Using a flow tester (CFT-500; made by Shimadzu Corporation), 0.2 grams of the aromatic liquid crystal polyester film was compressed and molded for one minute at 250° C. under a load of 100 kg, to obtain a test piece of the polyester film in disk form. Using a rheometer (made by BOHRIN INSTRUMENT), the test piece was heated to a temperature of 360° C., and in 20 minutes, the melt viscosity of the test piece was measured. As a result, the melt viscosity was 8,500 Pa·s.

Example 2

An aromatic liquid-crystalline polyester film and a test piece thereof were prepared in the same manners as in Example 1 except that 0.08 g of a benzoic anhydride as an aromatic carboxylic anhydrate, was used instead of using the phenyl acetate as an aliphatic carboxylate aryl ester. The melt viscosity of the test piece was 9,500 Pa·s.

Comparative Example 1

An aromatic liquid-crystalline polyester film and a test piece thereof were prepared in the same manners as in Example 1 except that the phenyl acetate was not used. The melt viscosity of the test piece was 22,300 Pa·s.

What is claimed is:

1. An aromatic liquid-crystalline polyester composition comprising:
    at least one compound selected from an aliphatic carboxylate aryl ester of formula (II) and an aromatic carboxylic anhydride;
    an aromatic liquid-crystalline polyester; and
    a solvent containing at least 30% by weight of a halogen-substituted phenol compound represented by formula (I):

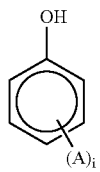

(I)

wherein A is a halogen atom or a tri-halogenated methyl and i is the number of A and is an integer of 1 to 5, provided that when i is an integer of 2 to 5, the substituents A are the same or different;

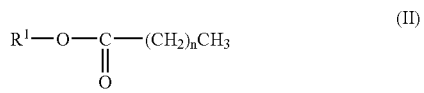

(II)

wherein n indicates an integer of from 0 to 2, and $R^1$ indicates an aryl group which has carbon atoms of from 6 to 20 and is optionally substituted with a halogen atom.

2. The composition according to claim 1, wherein the at least one compound is contained in the amount of about 0.1 part by weight to about 10 parts by weight on the basis of 100 parts by weight of the aromatic liquid-crystalline polyester, and the aromatic liquid-crystalline polyester is contained in the amount of about 0.5 part by weight to about 100 parts by weight on the basis of 100 parts by weight of the solvent.

3. A liquid-crystalline aromatic polyester film obtainable by casting the composition according to claim 1 onto a support into a film form and removing the solvent.

4. A laminate comprising the liquid-crystalline aromatic polyester film according to claim 3 and a metal layer.

5. A multi-layered board comprising at least one of the liquid-crystalline aromatic polyester film obtainable from the composition according to claim 1 and at least one of metal layer.

* * * * *